United States Patent
Oh et al.

(10) Patent No.: US 11,974,400 B2
(45) Date of Patent: Apr. 30, 2024

(54) SUPPORTER FOR ELECTRONIC COMPONENT

(71) Applicant: Samsung Display Co., Ltd., Yongin-si (KR)

(72) Inventors: Seyoung Oh, Osan-si (KR); Ki-Yong Park, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 225 days.

(21) Appl. No.: 17/607,378

(22) PCT Filed: Apr. 16, 2020

(86) PCT No.: PCT/KR2020/005094
§ 371 (c)(1),
(2) Date: Oct. 28, 2021

(87) PCT Pub. No.: WO2020/251157
PCT Pub. Date: Dec. 17, 2020

(65) Prior Publication Data
US 2022/0225509 A1 Jul. 14, 2022

(30) Foreign Application Priority Data
Jun. 14, 2019 (KR) ........................ 10-2019-0070388

(51) Int. Cl.
*H05K 7/02* (2006.01)
*H05K 1/14* (2006.01)
(Continued)

(52) U.S. Cl.
CPC ............. *H05K 1/189* (2013.01); *H05K 1/147* (2013.01); *H05K 2201/049* (2013.01);
(Continued)

(58) Field of Classification Search
CPC .. H05K 1/189; H05K 1/147; H05K 2201/049; H05K 2201/10128;
(Continued)

(56) References Cited

U.S. PATENT DOCUMENTS 5,989,088 A * 11/1999 Hasegawa ............. G02F 1/1333
29/430
6,190,997 B1 * 2/2001 Becker ............... H05K 13/0069
29/241
(Continued)

FOREIGN PATENT DOCUMENTS

JP 2001315959 A 11/2001
JP 2005202233 A 7/2005
(Continued)

OTHER PUBLICATIONS

International Search Report dated Jul. 24, 2020 for PCT/KR2020/005094.

*Primary Examiner* — Hoa C Nguyen
(74) *Attorney, Agent, or Firm* — CANTOR COLBURN LLP

(57) ABSTRACT

A supporter for electronic parts includes: an adsorption plate which is attached to an upper surface of a first electronic part among the first electronic part and a second electronic part where the first electronic part and a second electronic part are spaced apart from each other on a plane; and a supporting member which includes 1) a first support part which supports a lower surface of the second electronic part and 2) a connection part which connects the adsorption plate and the first support part. On the plane, about 70-90% of the area of the first support part is overlapped with the second electronic part.

15 Claims, 8 Drawing Sheets

(51) Int. Cl.
*H05K 1/18* (2006.01)
*H05K 13/00* (2006.01)

(52) U.S. Cl.
CPC .............. *H05K 2201/10128* (2013.01); *H05K 2201/10136* (2013.01); *H05K 2201/10424* (2013.01)

(58) Field of Classification Search
CPC .......... H05K 2201/10136; H05K 2201/10424; H05K 3/007; H05K 7/02; Y10T 29/53191; Y10T 29/53265; Y10T 29/53261
See application file for complete search history.

(56) References Cited

U.S. PATENT DOCUMENTS

| | | | |
|---|---|---|---|
| 6,230,394 B1* | 5/2001 | McWilliams | H05K 13/02 108/50.11 |
| 8,985,936 B2* | 3/2015 | Rankin | B25J 15/0608 414/796.4 |
| 9,711,902 B2 | 7/2017 | Kot et al. | |
| 2002/0133937 A1* | 9/2002 | Mochida | H05K 13/0061 29/840 |
| 2010/0059641 A1 | 3/2010 | Twesme et al. | |
| 2011/0318144 A1* | 12/2011 | Kobayashi | H01L 21/67173 414/222.01 |
| 2012/0050639 A1 | 3/2012 | Kim et al. | |
| 2013/0051071 A1* | 2/2013 | Lee | G02F 1/133308 361/679.01 |
| 2013/0291377 A1* | 11/2013 | Tanahashi | G02F 1/1303 29/714 |
| 2019/0038242 A1 | 2/2019 | Kim et al. | |
| 2019/0074674 A1 | 3/2019 | Martin | |
| 2019/0086017 A1 | 3/2019 | Illingworth et al. | |
| 2021/0328146 A1* | 10/2021 | Heymanns | H01L 21/682 |

FOREIGN PATENT DOCUMENTS

| | | |
|---|---|---|
| JP | 2008251787 A | 10/2008 |
| JP | 201846172 A | 3/2018 |
| KR | 100896445 B1 | 5/2009 |
| KR | 200449179 Y1 | 6/2010 |
| KR | 1020110055098 A | 5/2011 |
| KR | 101480524 B1 | 1/2015 |
| KR | 101812848 B1 | 12/2017 |
| KR | 101969839 B1 | 4/2019 |
| KR | 1020190053990 A | 5/2019 |

* cited by examiner

SUPPORTER FOR ELECTRONIC COMPONENT

TECHNICAL FIELD

The present invention relates to a supporter, and more particularly, to a supporter for an electronic component.

BACKGROUND ART

Various display devices used for multimedia devices such as televisions, mobile phones, tablet computers, navigation units, and game consoles have been developed. The display device may include a display module for displaying an image and sensing an external input, a polarizing layer disposed on the display panel, and a window. The display module may include a display panel for displaying an image and an input sensing unit for sensing an external input.

Also, the display device may include an electronic component for providing driving signals necessary to display an image of the display panel. The electronic component is electrically connected to the display panel and transmits the driving signals to the display panel.

DISCLOSURE OF THE INVENTION

Technical Problem

The present invention provides a supporter for an electronic component, which is capable of preventing an electronic component from being damaged and fixing a display panel and an electronic component.

Technical Solution

In order to achieve the objects of the present invention, a supporter for an electronic component according to an embodiment includes: an adsorption plate which is adsorbed to a top surface of a first electronic component among the first electronic component and a second electronic component, where the first electronic component and the second electronic component are spaced apart from each other on a plane; and a support including a first support part which supports a bottom surface of the second electronic component and a connection part which connects the adsorption plate and the first support part, and, on the plane, about 70 percentages (%) or more to about 90% or less of an area of the first support part overlaps the second electronic component.

According to an embodiment of the present invention, the first support part may include: a first support portion having a first length extending in a first direction and which supports the bottom surface of the second electronic component; a second support portion extending in a thickness direction of the second electronic component and connected to the connection part and a first end of the first support portion; and a third support portion adjacent to a second end of the first support portion and facing the second support portion in the first direction.

According to an embodiment of the present invention, the first length of the first support portion may be greater than a width of the second electronic component in the first direction.

According to an embodiment of the present invention, one portion of the connection part may overlap the first support portion on the plane, and the one portion of the connection part may overlap the first support portion by about 10% or less and more than 0% of the first support portion on the plane.

According to an embodiment of the present invention, the first support part may further include a fourth support portion extending in the first direction, facing the connection part and connected to the third support portion.

According to an embodiment of the present invention, the fourth support portion may overlap the first support portion by about 10% or less and more than 0% of the first support portion on the plane.

According to an embodiment of the present invention, in the thickness direction, a distance between the fourth support portion and the first support portion may be greater than a thickness of the second electronic component.

According to an embodiment of the present invention, the support may further include: a second support part spaced apart from the first support part on the plane and which supports the bottom surface of the second electronic component; and a body part disposed between the first support part and the second support part and having a first end connected to the first support part and a second end connected to the second support part.

According to an embodiment of the present invention, on the plane, about 70% or more to about 90% or less of an area of the second support part may overlap the second electronic component on the plane.

According to an embodiment of the present invention, the second support part may include: a first portion having a second length extending in the first direction and which supports the bottom surface of the second electronic component; a second portion extending in the thickness direction and being adjacent to a first end of the first portion; and a third portion adjacent to a second end of the first portion to face the second portion in the first direction.

According to an embodiment of the present invention, the second length of the first portion may be greater than a width of the second electronic component in the first direction.

According to an embodiment of the present invention, the connection part may have a curved shape.

According to an embodiment of the present invention, the adsorption plate may be made of a silicon material.

According to an embodiment of the present invention, a display device including the supporter for an electronic component may include: the first electronic component and the second electronic component; and a plurality of circuit boards disposed between the first electronic component and the second electronic component and spaced apart from each other in a second direction perpendicular to the first direction. The support and the adsorption plate may be disposed between two circuit boards, which are adjacent to each other in the second direction, among the circuit boards.

According to an embodiment of the present invention, the first electronic component of the display device may be provided as a display panel which displays an image, and the second electronic component of the display device may be provided as a driving circuit board.

Advantageous Effects

According to the embodiment of the present invention, the display panel corresponding to the first electronic component and the driving circuit board corresponding to the second electronic component are fixed to each other through the supporter. As a result, when the display device moves, one of the display panel and the driving circuit board, which are connected by the connection circuit board, may be prevented from individually moving.

Also, the supporter may support the bottom surface of the driving circuit board, and about 10% or less and more than 0% of the supporter may be covered by the top surface of the driving circuit board. As a result, more driving elements may be disposed on the top surface of the driving circuit board.

MODE FOR CARRYING OUT THE INVENTION

Figure 1A:
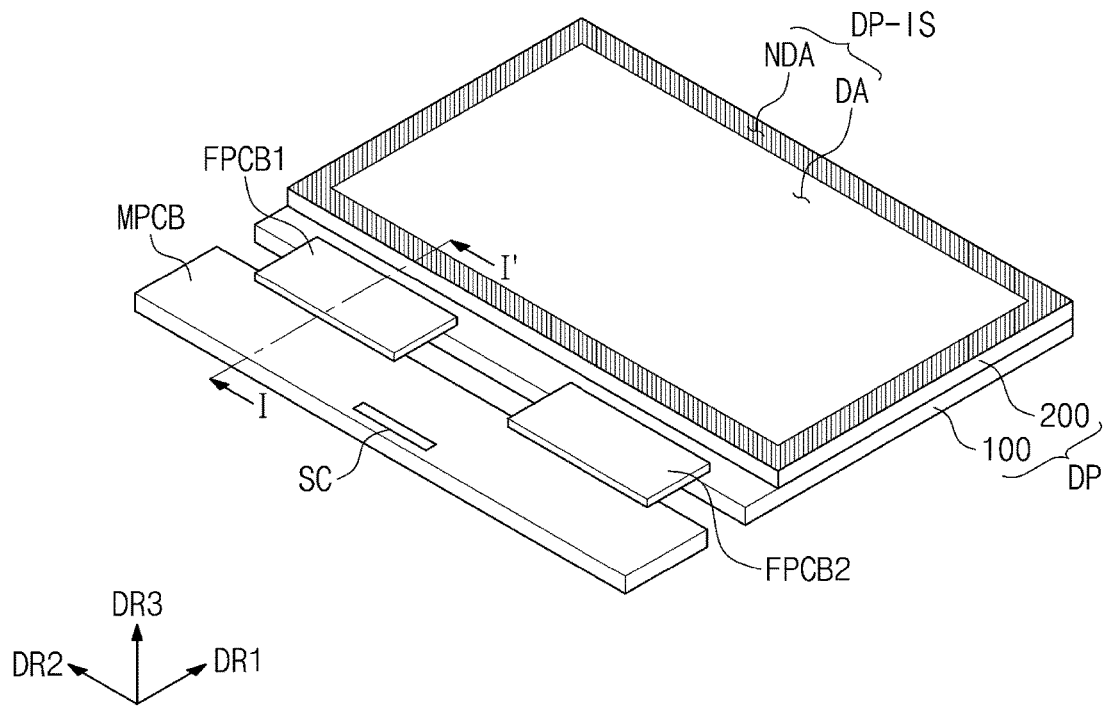
FIG. 1A is a perspective view of a display device according to an embodiment of the present invention.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the dimensions of components are exaggerated for clarity of illustration.

The term "and/or" includes any and all combinations of one or more of the associated listed items.

It will be understood that although the terms of first and second are used herein to describe various elements, these elements should not be limited by these terms. The terms are only used to distinguish one component from other components. For example, a first element referred to as a first element in one embodiment can be referred to as a second element in another embodiment. The terms of a singular form may include plural forms unless referred to the contrary.

Also, ""under", "below", "above", "upper", and the like are used for explaining relation association of components illustrated in the drawings. The terms are relative concepts and described with respect to the direction indicated in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a region, a fixed number, a step, a process, an element and/or a component but does not exclude other properties, regions, fixed numbers, steps, processes, elements and/or components.

Hereinafter, embodiments of the present invention will be described with reference to the accompanying drawings.

Figure 1B:
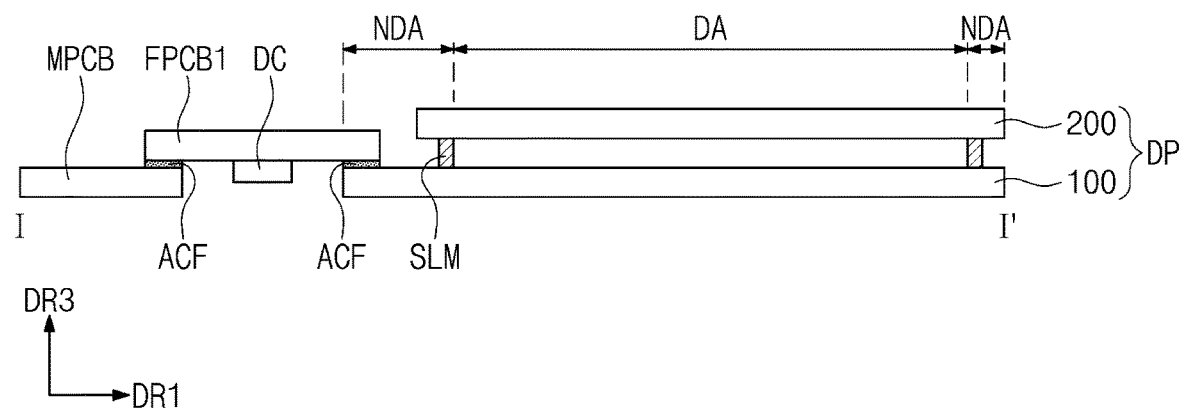
FIG. 1B is a cross-sectional view of the display device according to an embodiment of the present invention.

FIG. 1A is a perspective view of a display device according to an embodiment of the present invention. FIG. 1B is a cross-sectional view of the display device according to an embodiment of the present invention.

Referring to FIG. 1A, the display device includes a display panel DP, connection circuit boards FPCB1 and FPCB2, and a driving circuit board MPCB. Although not separately shown, the display device may further include a chassis member or a molding member and may further include a backlight unit according to the kind of the display panel DP.

According to an embodiment of the present invention, the display panel DP may be a light emitting display panel. However, the embodiment of the present invention is not particularly limited to the kind of the display panel DP. For example, the display panel DP may be an organic light emitting display panel or a quantum dot light emitting display panel. The organic light emitting display panel may include a light emitting layer containing an organic light emitting material. The quantum dot light emitting display panel may include a light emitting layer containing a quantum dot, a quantum rod, and the like. Hereinafter, the display panel DP will be described as an organic light emitting display panel.

The display panel DP may include a first display substrate 100 and a second display substrate 200 facing the first display substrate 100 and spaced apart from the first display substrate 100. A predetermined cell cap may be defined between the first display substrate 100 and the second display substrate 200. The cell gap may be maintained by a sealant SLM (refer to FIG. 1B) that couples the first display substrate 100 to the second display substrate 200. A gray scale display layer for image generation may be disposed between the first display substrate 100 and the second display substrate 200. The gray scale display layer may include a liquid crystal layer, an organic light emitting layer, and an electrophoretic layer according to the kind of display panel. Hereinafter, in this specification, the display panel DP will be described as a first electronic component.

As illustrated in FIG. 1A, the display panel DP may display an image through a display surface DP-IS. The display surface DP-IS is parallel to a plane defined by a first direction DR1 and a second direction DR2. The display surface DP-IS may include a display area DA and a non-display area NDA. The non-display area NDA is defined along an edge of the display surface DP-IS. The display area DA may be surrounded by the non-display area NDA. In an embodiment of the present invention, the non-display area NDA may be disposed at only one side area adjacent to the connection circuit boards FPCB1 and FPCB2.

A normal direction of the display surface DP-IS, i.e., a thickness direction of the display panel DP, indicates a third direction DR3. In this specification, an expression of "when viewed on a plane, on a plane, or an area on a plane" may represent a case when viewed in the third direction DR3. Hereinafter, a front surface (or a top surface) and a rear surface (or a bottom surface) of each of layers or units are distinguished by the third direction DR3. However, the first to third directions DR1, DR2, and DR3 are intended to be illustrative in this embodiment. Hereinafter, first to third directions may be directions indicated by the first to third directions DR1, DR2, and DR3, respectively, and designated by the same reference numerals, respectively.

Although the display panel DP having a flat display surface is illustrated in an embodiment of the present invention, the embodiment of the present invention is not limited thereto. The display device may include a curved display surface or a three-dimensional display surface in another embodiment. The three-dimensional display surface may include a plurality of display areas indicating different directions from each other.

The driving circuit board MPCB may be provided as a printed circuit board having a rigid property. The driving circuit board MPCB provides an electrical signal necessary for driving the display panel DP. For example, a signal control unit SC for generating an electrical signal to be provided to the display panel DP may be mounted on the driving circuit board MPCB. The signal control unit SC may receive image data and a control signal from an external graphic control unit (not shown) and provide the received image data and control signal to the display panel DP through the first and second connection circuit boards FPCB1 and FPCB2.

Each of the first and second connection circuit boards FPCB1 and FPCB2 may be provided as a flexible printed circuit board having a flexible property. Each of the first and second connection circuit boards FPCB1 and FPCB2 electrically connects the display panel DP and the driving circuit board MPCB. For example, the first connection circuit board FPCB1 and the second connection circuit board FPCB2 may be spaced apart from each other on a plane and face each other in the second direction DR2. Each of the first and second connection circuit boards FPCB1 and FPCB2 may have one end electrically connected to the display panel DP and the other end electrically connected to the driving circuit board MPCB.

Hereinafter, in this specification, the driving circuit board MPCB will be described as a second electronic component, and the first and second connection circuit boards FPCB1 and FPCB2 will be described as a third electronic component. Although two connection circuit boards are illustrated in FIG. 1A, the embodiment of the present invention is not limited thereto. For example, one connection circuit board may be provided in another embodiment.

Referring to FIG. 1B, the first and second connection circuit boards FPCB1 and FPCB2 may be bonded to each of the display panel DP and the driving circuit board MPCB by a conductive adhesive member ACF. For example, the conductive adhesive member may be an anisotropic conductive film.

A driving chip DC may be mounted on the first connection circuit board FPCB1. The driving chip DC may provide driving signals to the display panel DP in response to an electrical signal provided from the signal control unit SC mounted on the driving circuit board MPCB. Although not shown, the driving chip DC may be also mounted on the second connection circuit board FPCB2.

Figure 2:
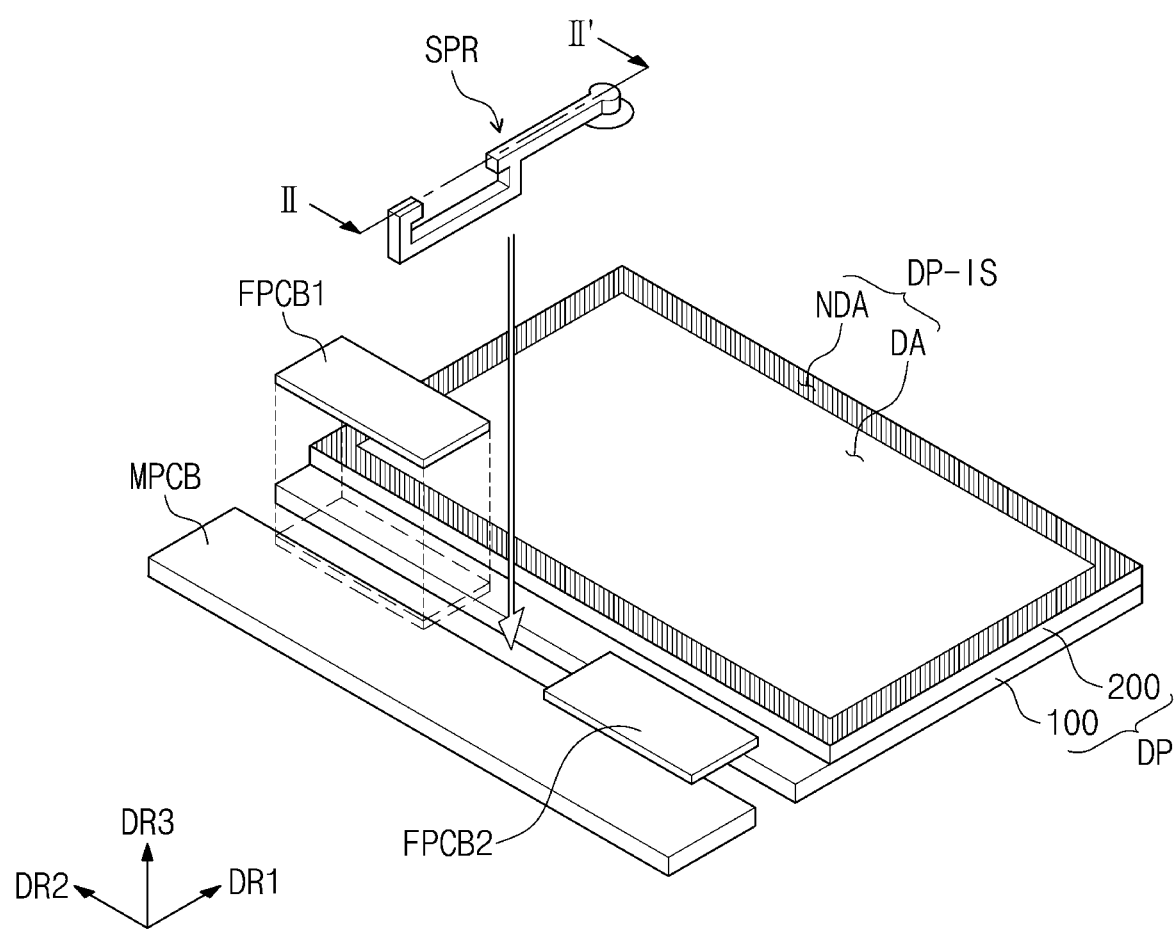
FIG. 2 is an exploded perspective view illustrating the display device and a supporter according to an embodiment of the present invention.
Figure 3A:
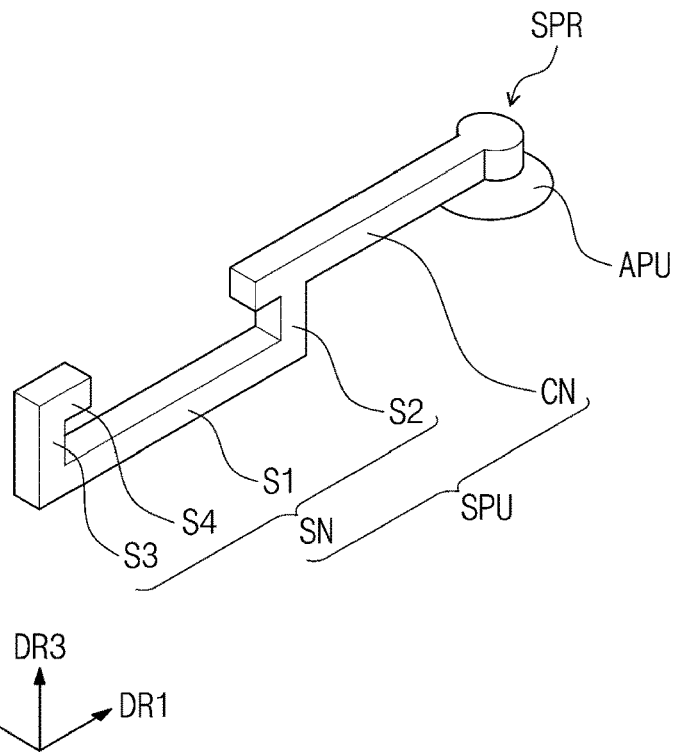
FIG. 3A is a perspective view illustrating the supporter in FIG. 2 according to an embodiment of the present invention.
Figure 3B:
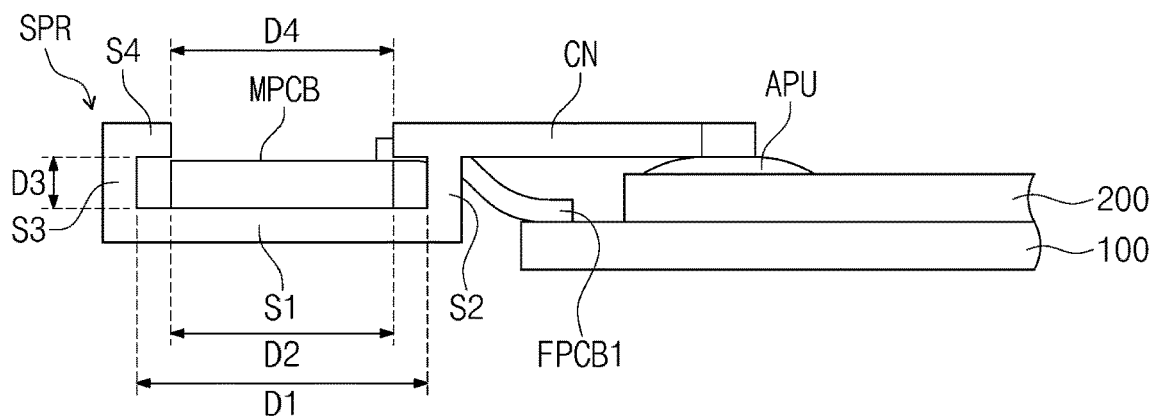
FIG. 3B is a cross-sectional view taken along line I-I' of FIG. 2 according to an embodiment of the present invention.
Figure 3B:
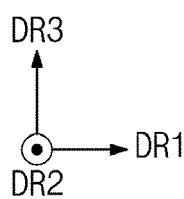
Figure 4A:
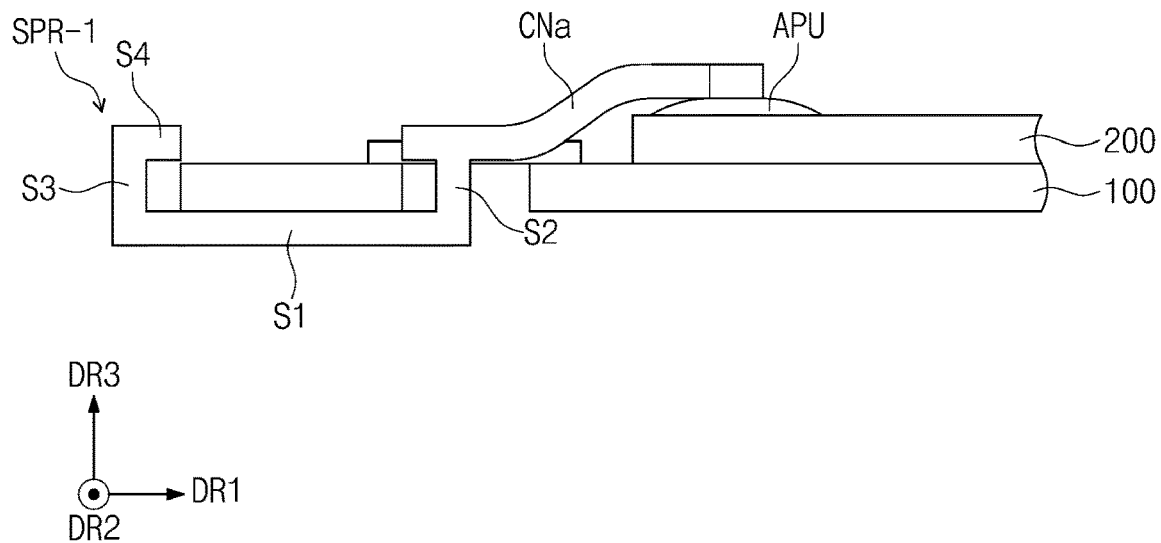
FIG. 4A is a cross-sectional view taken along line I-I' of FIG. 2 according to another embodiment of the present invention.
Figure 4B:
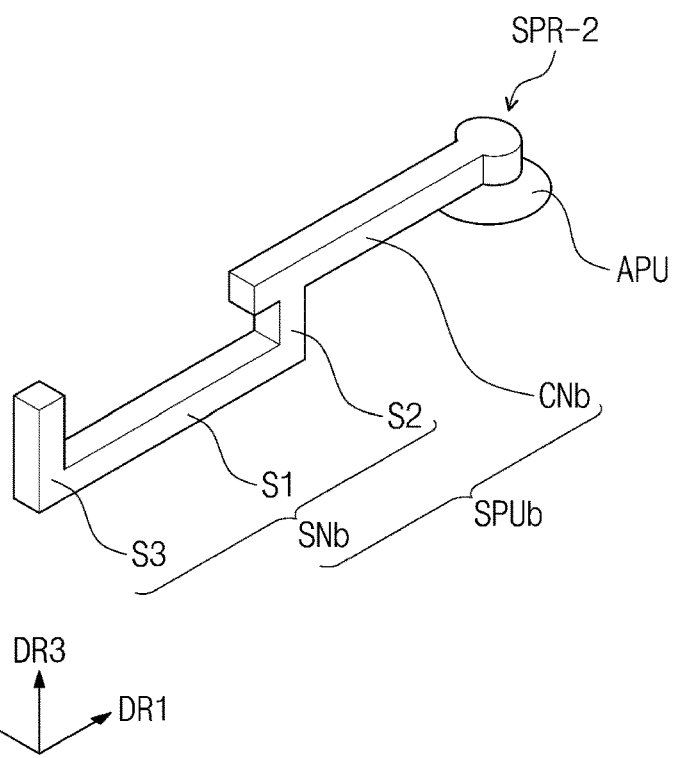
FIG. 4B is a perspective view illustrating the supporter in FIG. 2 according to still another embodiment of the present invention.

FIG. 2 is an exploded perspective view illustrating the display device and a supporter according to an embodiment of the present invention. FIG. 3A is a perspective view illustrating the supporter according to an embodiment of the present invention. FIG. 3B is a cross-sectional view taken along line of FIG. 2 according to an embodiment of the present invention. FIG. 4A is a cross-sectional view taken along line of FIG. 2 according to another embodiment of the present invention. FIG. 4B is a perspective view illustrating the supporter in FIG. 2 according to another embodiment of the present invention.

Referring to FIG. 2, a supporter SPR is additionally illustrated in addition to components of the display device in FIG. 1A.

As described above, as each of the first and second connection circuit boards FPCB1 and FPCB2 is provided as the flexible circuit board, one of the driving circuit board MPCB and the display panel DP may independently move in the third direction DR3 when the display device moves.

According to an embodiment of the present invention, the supporter SPR may prevent one of the driving circuit board MPCB and the display panel DP, which are connected by the first and second connection circuit boards FPCB1 and FPCB2, from individually moving. Particularly, the supporter SPR may prevent the display panel DP and the driving circuit board MPCB from moving in the third direction DR3.

Hereinafter, in this specification, a structure in which the supporter SPR is connected to the display panel DP corresponding to the first electronic component and the driving circuit board MPCB corresponding to the second electronic component will be described.

Specifically, referring to FIG. 3A, the supporter SPR may include an adsorption plate APU and a support SPU. The adsorption plate APU may include or be made of a silicon or rubber material and have a circular shape on the plane. The adsorption plate APU may adsorbed a top surface of the display panel DP. The top surface of the display panel DP may represent a top surface of the second display substrate 200. As described above, the display panel DP may be fixed to the supporter SPR by the adsorption plate APU.

The support SPU may include a connection part CN and a support part SN. The support SPU may have a rigid property and include or be made of, e.g., plastic. The connection part CN may have a shape extending in the first direction DR1 and have a first end connected to the adsorption plate APU.

The support part SN according to an embodiment of the present invention includes first to fourth support portions S1, S2, S3, and S4. The first support portion S1 may have a shape extending in the first direction DR1 and support a bottom surface of the driving circuit board MPCB. The first support portion S1 may have a top surface that directly contacts the driving circuit board MPCB to support the driving circuit board MPCB (See FIG. 3B). The first support portion S1 may be spaced apart from the connection part CN in the third direction DR3, and one portion of the connection part CN may overlap the first support portion S1.

The second support portion S2 may extend in the third direction DR3 and be disposed between the connection part CN and a first end of the first support portion S1. The second support portion S2 has a first end connected adjacently to a second end of the connection part CN and a second end connected to the first end of the first support portion S1.

The third support portion S3 extends in the third direction DR3. The third support portion S3 may face the second support portion S2 in the first direction DR1 and have the substantially same length as the second support portion S2 in the third direction DR3.

The fourth support portion S4 extends in the first direction DR1. The fourth support portion S4 may be spaced apart from the first support portion S1 in the third direction DR3 by the third support portion S3 and overlap one portion of the first support portion S1 on the plane. Particularly, the fourth support portion S4 may face the connection part CN in the first direction DR1. The fourth support portion S4 may be spaced apart from the connection part CN in the first direction DR1.

According to the present invention, the connection part CN and the first to fourth support portions S1, S2, S3, and S4 of the support part SN may have an integrated shape (i.e., monolithic).

Referring to FIG. 3B, a length of the first support portion S1 in the first direction DR1 may be defined as a first length D1. A width of the driving circuit board MPCB in the first direction DR1 may be defined as a second length D2. In the third direction DR3, a spaced distance between the fourth support portion S4 and a top surface of the first support portion S1 may be defined as a third length D3. In the first direction DR1, a spaced distance between the fourth support portion S4 and the connection part CN may be defined as a fourth length D4.

According to an embodiment of the present invention, in the first direction DR1, the first length D1 of the first support portion S1 may be greater than the second length D2 that is the width of the driving circuit board MPCB. Also, in the third direction DR3, the third length D3 that is the spaced distance between the fourth support portion S4 and the top surface of the first support portion S1 may be greater than a thickness of the driving circuit board MPCB. The driving circuit board MPCB may be spaced at least a portion apart from the fourth support portion S4 and the connection part CN in the third direction DR3.

The fourth length D4 that is the spaced distance between the fourth support portion S4 and the connection part CN in the first direction DR1 may be equal to or greater than the second length D2 that is the width of the driving circuit board MPCB in the first direction DR1.

According to the present invention, when the driving circuit board MPCB is disposed on the first support portion S1, about 70 percentages (%) or more to about 90% or less of an area of the first support portion S1 may overlap the driving circuit board MPCB on the plane. That is, about 70% or more to about 90% or less of an area of a top surface of the first support portion S1 may contact a bottom surface of the driving circuit board MPCB to support the driving circuit board MPCB.

Here, a top surface of the driving circuit board MPCB represents a surface on which the connection circuit boards FPCB1 and FPCB2 are disposed, and the bottom surface of the driving circuit board MPCB represents a surface opposite to the top surface of the driving circuit board MPCB. Also, the top surface of the first support portion S1 represents a surface supporting the driving circuit board MPCB, and a bottom surface of the first support portion S1 represents a surface opposite to the top surface of the first support portion S1.

According to the above description, the top surface of the driving circuit board MPCB may have an area covered by the fourth support portion S4 and the connection part CN, which is about 10% or less and more than 0%. As a result, when the display device moves, the fourth support portion S4 and the connection part CN may prevent circuit elements or circuit lines disposed on the top surface of the driving circuit board MPCB from being damaged. Also, as the area of the driving circuit board MPCB, which is covered by the fourth support portion S4 and the connection part CN, is equal to or less than about 10% and more than 0%, more driving elements may be disposed on the top surface of the driving circuit board MPCB.

Referring to FIG. 4A, a supporter SPR-1 in which a structure of a connection part CNa is deformed is illustrated. The supporter SPR-1 in FIG. 4A may have the substantially same structure as the supporter SPR in FIG. 3B except for the deformed structure of the connection part CNa.

As illustrated in FIG. 4A, the connection part CNa may have a curved shape. That is, the connection part CNa may have hardness capable of connecting a support part SN and an adsorption plate APU and also have a property that is bent by an external physical force at a certain level.

Referring to FIG. 4B, a supporter SPR-2 in which a partial structure of a support part SNb is deformed is illustrated. The supporter SPR-2 in FIG. 4B may have the substantially same structure as the supporter SPR in FIG. 3A except for the deformed structure of the support part SNb.

The support part SNb in FIG. 4B may have a structure from which the fourth support portion S4 is omitted in comparison with the support part SN in FIG. 3A.

Figure 5:
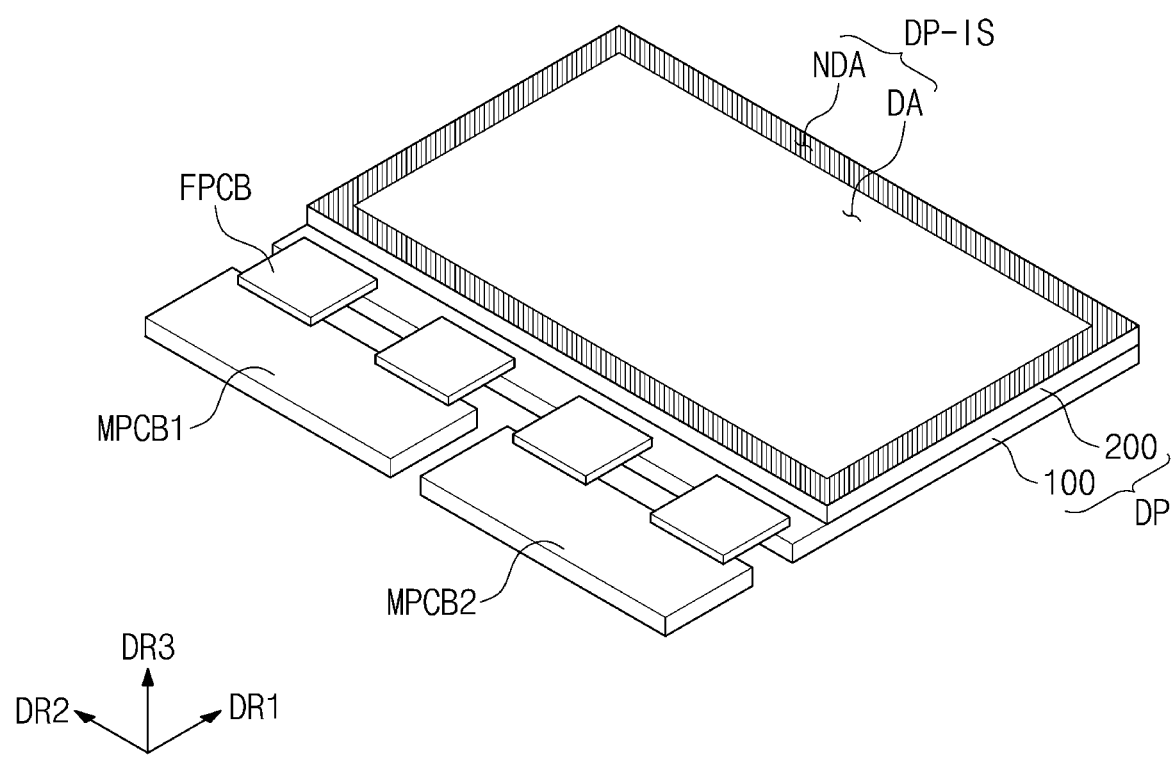
FIG. 5 is a perspective view illustrating a display device according to another embodiment of the present invention.
Figure 6:
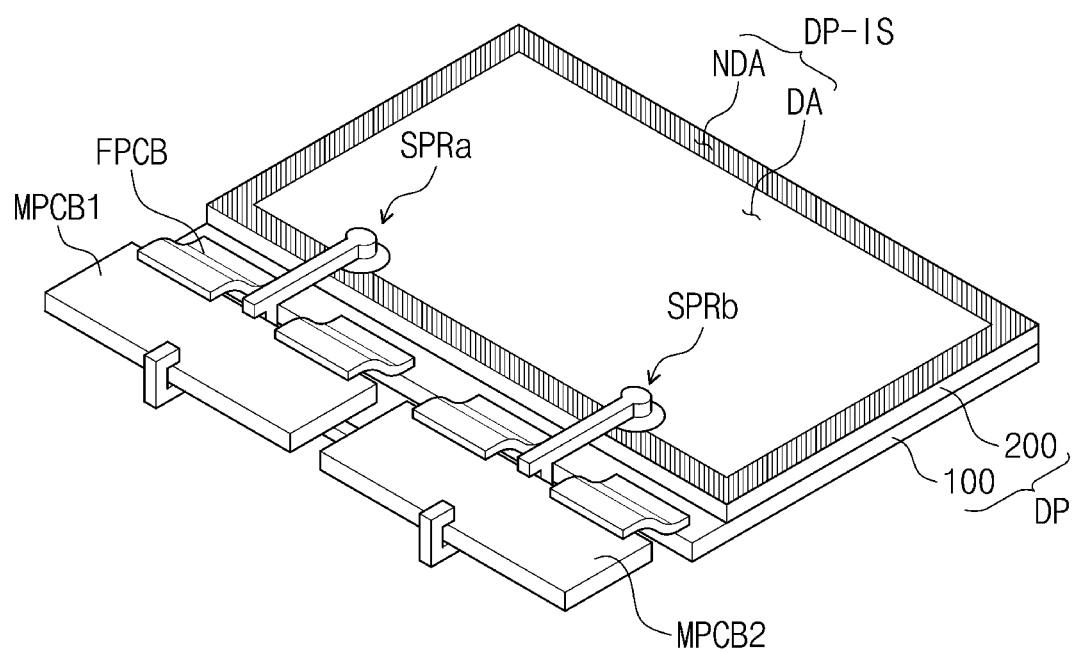
FIG. 6 is a perspective view illustrating the display device and a supporter according to another embodiment of the present invention.

FIG. 5 is a perspective view illustrating a display device according to another embodiment of the present invention. FIG. 6 is a perspective view illustrating a display device and a supporter according to another embodiment of the present invention.

Referring to FIG. 5, a structure in which two driving circuit boards MPCB1 and MPCB2 are electrically connected to a display panel DP is disclosed. A first driving circuit board MPCB1 and a second driving circuit board MPCB2 may be spaced apart from each other on the plane and electrically connected to the display panel DP.

Referring to FIG. 6, a first supporter SPRa may be connected to the first driving circuit board MPCB1 and the display panel DP and prevent the first driving circuit board MPCB1 and the display panel DP from moving when the display device moves. A second supporter SPRb may be connected to the second driving circuit board MPCB2 and the display panel DP and prevent the second driving circuit board MPCB2 and the display panel DP from moving when the display device moves.

Also, each of the first supporter SPRa and the second supporter SPRb in FIG. 6 may have the same structure as the supporter SPR in FIG. 2.

Figure 7:
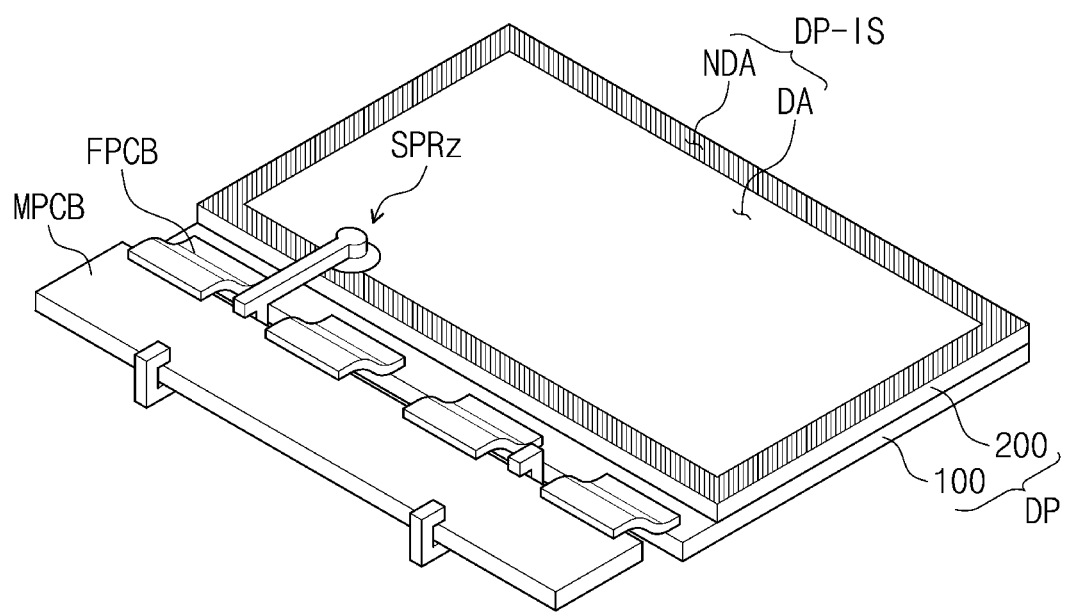
FIG. 7 is a perspective view illustrating the display device and a supporter according to still another embodiment of the present invention.
Figure 8:
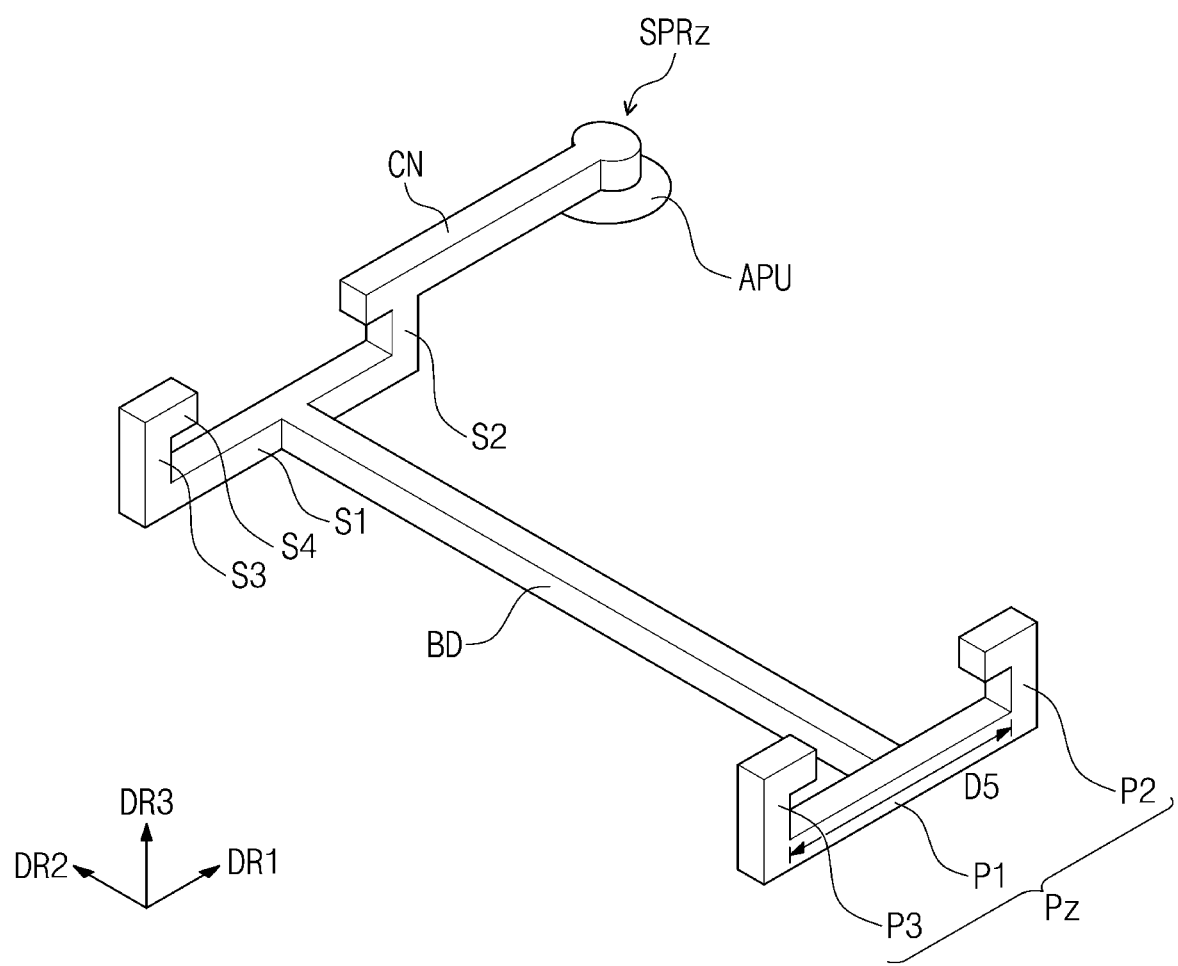
FIG. 8 is a perspective view illustrating the supporter in FIG. 7 according to still another embodiment of the present invention.

FIG. 7 is a perspective view illustrating a display device and a supporter according to another embodiment of the present invention. FIG. 8 is a perspective view illustrating the supporter in FIG. 7 according to another embodiment of the present invention.

Referring to FIG. 7, a supporter SPRz may include two supports for supporting two portions of a driving circuit board MPCB. The two supports may be spaced apart from each other on the plane and support the driving circuit board MPCB.

Specifically, referring to FIG. 8, the supporter SPRz additionally includes a second support part Pz and a body part BD in addition to the adsorption plate APU, the connection part CN, and the support part SN in FIG. 3A. Hereinafter, the support part SN described in FIG. 3A will be described as a first support part.

Firstly, since the adsorption plate APU, the connection part CN, and the support part SN in FIG. 8 may have the substantially same structure as those in FIG. 3A, a description thereof will be omitted.

A second support part Pz includes first to third portions P1, P2, and P3. The first portion P1 may have a shape extending in the first direction DR1 and support a bottom surface of the driving circuit board MPCB. The first portion P1 may have a top surface that directly contacts the driving circuit board MPCB to support the driving circuit board MPCB.

According to the present invention, a length D5 of the first portion P1 in the first direction DR1 may be greater than a width of the driving circuit board MPCB in the first direction DR1. That is, when the driving circuit board MPCB is disposed on the first portion P1, about 70% or more to about 90% or less of an area of the first portion P1 may overlap the driving circuit board MPCB corresponding to the second electronic component on the plane.

The second portion P2 includes a first sub-portion extending in the third direction DR3 and a second sub-portion extending in the first direction DR1. The first sub-portion of the second portion P2 connects a first end of the first portion P1 and the second sub-portion of the second portion P2. The second sub-portion of the second portion P2 may face the first portion P1. For example, the second sub-portion of the second portion P2 may overlap the first portion P1 by about 10% or less and more than 0% on the plane.

The third portion P3 includes a first sub-portion extending in the third direction DR3 and a second sub-portion extending in the first direction DR1. The first sub-portion of the third portion P3 connects a second end of the first portion P1 and the second sub-portion of the third portion P3. The second sub-portion of the third portion P3 may face the second sub-portion of the second portion P2 in the first direction DR1 and face the first portion P1 in the third direction DR3. For example, the second sub-portion of the third portion P3 may overlap the first portion P1 by about 10% or less and more than 0% on the plane.

The body part BD has a shape extending in the second direction DR2 and is disposed between the first support part SN and the second support part Pz. The body part BD has a first end connected to the first support part SN and a second end connected to the second support part Pz. The body part BD may be integrated (i.e., monolithic) with the first support part SN and the second support part Pz.

Each of the first support part SN and the second support part Pz may be disposed between two adjacent connection circuit boards among a plurality of connection circuit boards. That is, on the plane, each of the first support part SN and the second support part Pz may not overlap the connection circuit boards.

The present invention has been particularly shown and described with reference to exemplary embodiments thereof. While specific terms were used, they were not used to limit the meaning or the scope of the present invention described in claims, but merely used to explain the present invention. Accordingly, a person having ordinary skill in the art will understand from the above that various modifications and other equivalent embodiments are also possible. Hence, the real protective scope of the present invention shall be determined by the technical scope of the accompanying claims.

INDUSTRIAL APPLICABILITY

The technology of supporting the display panel and the circuit board by using the supporter provides convenience in movement of the display panel and the circuit board, which are coupled to each other. Thus, the present invention that provides the supporter for fixing the display panel and the circuit board has a high industrial applicability.

The invention claimed is:

1. A supporter for an electronic component, comprising:
an adsorption plate which is adsorbed to a top surface of a first electronic component among the first electronic component and a second electronic component, wherein the first electronic component and the second electronic component are spaced apart from each other on a plane; and
a support comprising a first support part which supports a bottom surface of the second electronic component and a connection part which connects the adsorption plate and the first support part,
wherein, on the plane, about 70 percentages (%) or more to about 90% or less of an area of the first support part overlaps the second electronic component.

2. The supporter of claim 1, wherein the first support part comprises:
a first support portion having a first length extending in a first direction and which supports the bottom surface of the second electronic component;
a second support portion extending in a thickness direction of the second electronic component and connected to the connection part and a first end of the first support portion; and
a third support portion adjacent to a second end of the first support portion and facing the second support portion in the first direction.

3. The supporter of claim 2, wherein the first length of the first support portion is greater than a width of the second electronic component in the first direction.

4. The supporter of claim 3, wherein one portion of the connection part overlaps the first support portion on the plane, and
the one portion of the connection part overlaps the first support portion by about 10% or less and more than 0% on the plane.

5. The supporter of claim 2, wherein the first support part further comprises a fourth support portion extending in the first direction, facing the connection part, and connected to the third support portion.

6. The supporter of claim 5, wherein the fourth support portion overlaps the first support portion by about 10% or less and more than 0% on the plane.

7. The supporter of claim 5, wherein, in the thickness direction, a distance between the fourth support portion and the first support portion is greater than a thickness of the second electronic component.

8. The supporter of claim 2, wherein the support further comprises:
a second support part spaced apart from the first support part on the plane and which supports the bottom surface of the second electronic component; and
a body part disposed between the first support part and the second support part and having a first end connected to the first support part and a second end connected to the second support part.

9. The supporter of claim 8, wherein, on the plane, about 70% or more to about 90% or less of an area of the second support part overlaps the second electronic component.

10. The supporter of claim 8, wherein the second support part comprises:
a first portion having a second length extending in the first direction and which supports the bottom surface of the second electronic component;
a second portion extending in the thickness direction and being adjacent to a first end of the first portion; and
a third portion adjacent to a second end of the first portion to face the second portion in the first direction.

11. The supporter of claim 10, wherein the second length of the first portion is greater than a width of the second electronic component in the first direction.

12. The supporter of claim 1, wherein the connection part has a curved shape.

13. The supporter of claim 1, wherein the adsorption plate is made of a silicon material.

14. A display device including the supporter of claim 1, comprising:
- the first electronic component and the second electronic component; and
- a plurality of circuit boards disposed between the first electronic component and the second electronic component and spaced apart from each other in a second direction perpendicular to the first direction,
- wherein the support and the adsorption plate are disposed between two circuit boards, which are adjacent to each other in the second direction, among the circuit boards.

15. The display device of claim 14, wherein the first electronic component is provided as a display panel which displays an image, and the second electronic component is provided as a driving circuit board.

\* \* \* \* \*